United States Patent [19]
Roxlo et al.

[11] Patent Number: 4,590,399
[45] Date of Patent: May 20, 1986

[54] SUPERLATTICE PIEZOELECTRIC DEVICES

[75] Inventors: Charles B. Roxlo, Bridgewater; Peter D. Persans, Flemington, both of N.J.

[73] Assignee: Exxon Research and Engineering Co., Florham Park, N.J.

[21] Appl. No.: 659,172

[22] Filed: Oct. 9, 1984

Related U.S. Application Data

[63] Continuation-in-part of Ser. No. 584,486, Feb. 28, 1984, abandoned.

[51] Int. Cl.$^4$ .................................. H01L 41/08
[52] U.S. Cl. .................................. 310/334; 310/311; 310/358; 310/800
[58] Field of Search .................... 310/334–337, 310/800, 311, 358, 359; 357/4, 16

[56] References Cited

U.S. PATENT DOCUMENTS

| | | | |
|---|---|---|---|
| 3,543,058 | 11/1970 | Klemens | 310/334 X |
| 4,427,913 | 1/1984 | Iafrate et al. | 310/334 |
| 4,469,977 | 9/1984 | Quinn et al. | 310/334 |

Primary Examiner—Mark O. Budd
Attorney, Agent, or Firm—Ronald D. Hantman

[57] ABSTRACT

Piezoelectric transducers and oscillators made from amorphous superlattice structures are disclosed. These materials have large built-in fields necessary for piezoelectricity but they are materials which can be deposited at low temperatures onto virtually any substrate.

11 Claims, 9 Drawing Figures

SUPERLATTICE PIEZOELECTRIC DEVICES

CROSS REFERENCE TO RELATED APPLICATIONS

This application is a continuation-in-part of U.S. Ser. No. 584,486, filed Feb. 28, 1984, now abandoned.

BACKGROUND OF THE INVENTION

The present invention relates to piezoelectric devices whose active material is a superlattice material.

A piezoelectric material is one that exhibits the piezoelectric effect. Piezoelectricity is electricity, or electric polarity, resulting from the application of mechanical pressure on a dielectric crystal. It has long been known that the application of a mechanical stress produces in certain dielectric (electrically nonconducting) crystals an electric polarization (electric dipole) moment per cubic meter which is proportional to this stress. If the crystal is isolated, this polarization manifests itself as a voltage across the crystal, and if the crystal is short-circuited, a flow of charge can be observed during loading. Conversely, application of a voltage between certain faces of the crystal produces a mechanical distortion of the material. This reciprocal relationship is referred to as the piezoelectric effect. The phenomenon of generation of a voltage under mechanical stress is referred to as the direct piezoelectric effect, and the mechanical strain produced in the crystal under electric stress is called the converse piezoelectric effect.

The necessary condition of the piezoelectric effect is the absence of a center of symmetry in the crystal structure. Of the 32 crystal classes, 21 lack a center of symmetry, and with the exception of one class, all of these are piezoelectric. In the crystal class of lowest symmetry, any type of stress generates an electric polarization whereas in crystals of higher symmetry, only particular types of stress can produce a piezoelectric polarization.

Piezoelectric materials are used extensively in transducers for converting a mechanical strain into an electrical signal. Such devices include microphones, phonographic pickups, vibration-sensing elements, and the like. The converse effect, in which a mechanical output is derived from an electrical signal input, is also widely used in such devices as sonic and ultrasonic transducers, headphones, loudspeakers, and cutting heads for disk recording. Both the direct and converse effects are employed in devices in which the mechanical resonance frequency of the crystal is of importance. Such devices include electric wave filters and frequency-control elements in electronic oscillators.

As described above, only non-centrosymmetric materials can exhibit piezoelectricity. Crystals sometimes have preferred directions defined by the crystalline axes and thus are often used for their piezoelectric properties. However, piezoelectric crystals are difficult to make as a thin film, because the material must be oriented. Recently, layered amorphous semiconductor structures have been synthesized which exhibit many properties similar to crystalline superlattices, including quantum carrier confinement, see e.g., B. Abeles and T. Tiedje, Phys. Rev. Lett. 51, 2003 (1983); L. Esaki and R. Tsu, IBM J. Res. and Dev. 14, 61 (1970); and H. Munekato and H. Kukimoto, Jap. J. Appl. Phys. 22, L542 (1983). These materials have conductivity, luminescence, and X-ray scattering properties which indicate that the interfaces are smooth on an atomic scale. In the present invention, it is shown that the semiconductor superlattices developed here have substantial built-in electric fields perpendicular to the layers. These fields break the symmetry of the material and make it suitable for a piezoelectric device.

A piezoelectric transducer made from amorphous superlattice materials would have the advantage that it could be deposited onto a wide variety of substrates at a relatively low temperature. Deposition onto substrates of different shapes would yield transducers sensitive to different acoustic waves. For example, a long, cylindrical transducer sensitive to long-wavelength pressure fluctuations could be made conveniently by coating a wire with piezoelectric amorphous superlattice material. This design freedom is not possible with currently available transducer materials.

SUMMARY OF THE INVENTION

The present invention is a piezoelectric device whose active material exhibits the piezoelectric effect in a superlattice which includes a multilayered material in which electric fields exist between adjacent layers. The active material may be crystalline or amorphous provided that the material lacks reflection symmetry.

In a preferred embodiment, the present invention includes an amorphous superlattice material. In another embodiment, the superlattice is a-Si:H/a-SiN$_x$:H.

DESCRIPTION OF THE PREFERRED EMBODIMENT

For purposes of illustration, the present invention will be described by a piezoelectric device whose active material which exhibits the piezoelectric effect is an amorphous superlattice material. Such a description is not intended to limit the scope of the invention.

SUPERLATTICE MATERIAL

Figure 3:
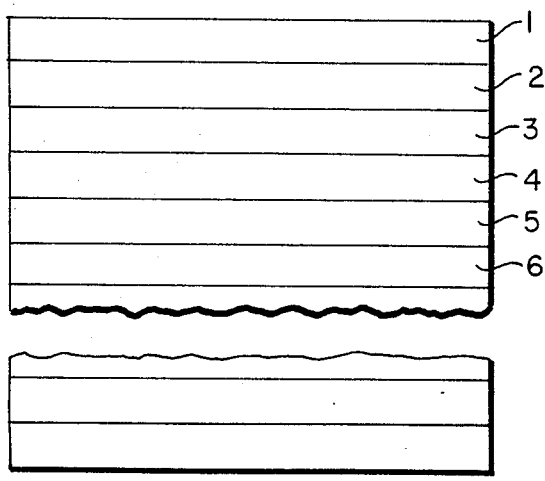
FIG. 3 shows a multilayered structure of alternating wide bandgap and narrow bandgap amorphous semiconductor layers.

An amorphous superlattice includes multilayered material whose layers are thin sheets of semiconducting or insulating amorphous material. In a preferred embodiment, the material is formed from tetrahedrally bonded elements or alloys containing said tetrahedrally bonded elements. Each layer is less than 1500 Å thick. In a preferred embodiment, the entire layered structure is a thin film material, that is a material that is less than about 10 microns thick. Referring to FIG. 3 the first and alternate layers 1, 3, 5 of the structure have the same given composition while the second and alternate layers 2, 4, 6 . . . have the same composition different from the given composition of layers 1, 3, 5 . . . . Therefore, the spatial repeat distance of the material is the thickness of layer 1 plus layer 2. That is, layer 3 plus layer 4 is a repeat of layer 1 plus layer 2, etc.

A superlattice material can also be made up of three types of layers, where layers 1,4, 7 . . . are of the first type, 2, 5, 8 . . . are of the second type, and so on. Alternatively, the material composition can be graded continuously, with the composition returning to the original value after a certain repeat distance and the entire cycle starting again.

Superlattice materials can be made up of amorphous materials or of crystalline.

The optical bandgap (as discussed below) of the composition may differ from that of materials comprising the individual layers. In a preferred embodiment, the repeat distance is of order 20 Å.

Figure 1:
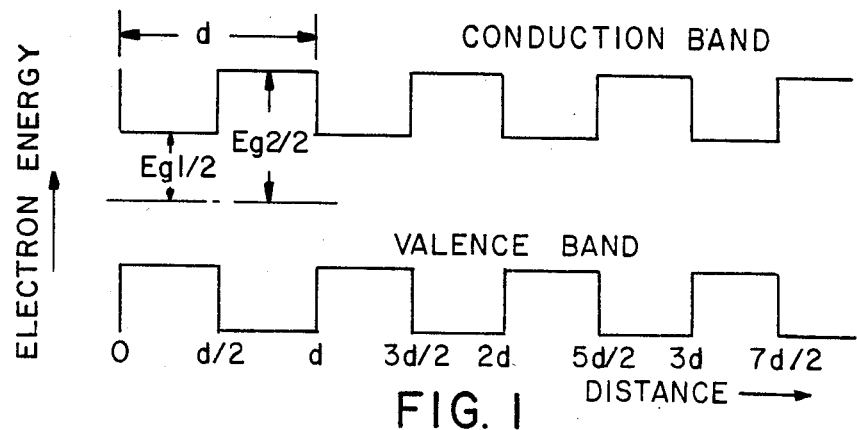
FIG. 1 shows a schematic energy band diagram for electrons and holes in semiconductor superlattice material, in which the compositional modulation is due to alloying or other gross compositional variation.
Figure 2:
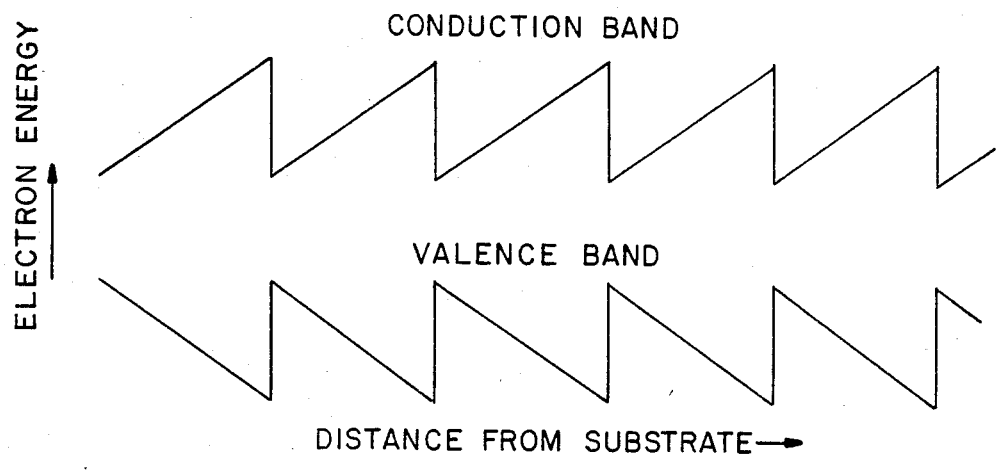
FIG. 2 shows an energy band diagram for a semiconductor superlattice material in which the compositional modulation is asymmetrically applied being gradual in one direction and abrupt in the other.

A description of the electronic energy levels in terms of well defined E vs k relations, where E is the electronic energy and k is its wavevector, is not possible in amorphous semiconductors in the same way as it is in crystalline semiconductors. Nevertheless, some general features of the electronic energy level spectrum are known to be the same in both crystalline and low defect density amorphous semiconductors. For example, both types of semiconductors have a gap in the density of states between a broad distribution of filled levels (the valence band) and a broad distribution of empty levels (the conduction band). In crystals these energy bands have relatively sharp edges, broadened only by the thermal motion of the crystal lattice. In amorphous semiconductors the density of states edges are broader, being broadened by the structural disorder of the amorphous network in addition to the thermal motion of the atoms. The width of the low energy absorption tail of the optical absorption edge is one measure of the sharpness of the band edges in amorphous or crystalline semiconductors. In any case, an objective measure of the position of the band edges can be defined for both crystalline or amorphous semiconductors by, for example, the energy at which the density of states of the bulk material drops to $10^{20}$ cm$^{-3}$ev.$^{-1}$. In this sense, energy band diagrams such as those shown in FIGS. 1 and 2, as described above can equally well be applied to amorphous and crystalline semiconductors. The modulation in the band edge energies illustrated in FIGS. 1 and 2 is obtained by modulation of the thin film composition.

Figure 4:
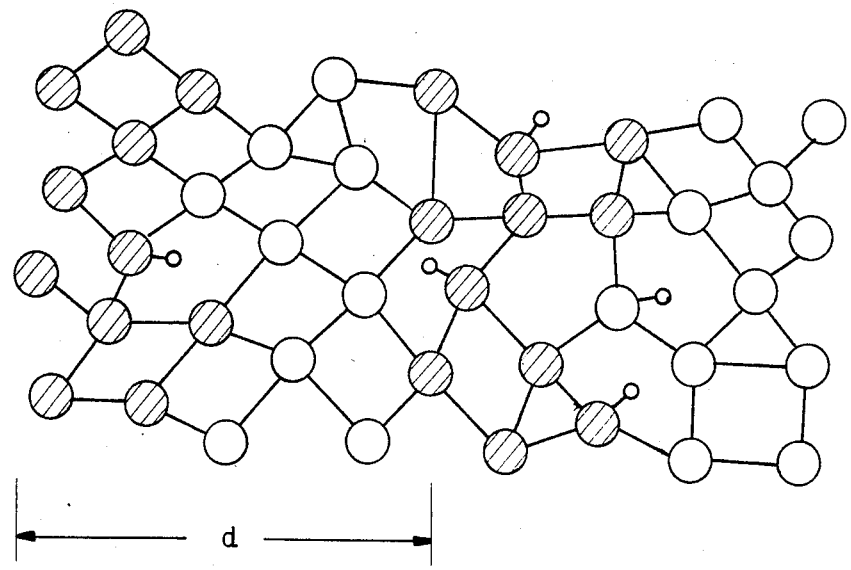
FIG. 4 is a schematic diagram of the position of the individual atoms in the superlattice structure of the present invention.

The interfacial regions between the layers of the composition of matter of the present invention are substantially defect free. There exist some defects at the intefaces which cause built-in electric fields, as will be discussed below. Referring to FIG. 4 shows a schematic diagram of the lattice structure of the present invention in which the atoms of the alternating layers are indicated by light and dark circles and hydrogen atoms by smaller light circles. The period of structures is d. As is well-known in the art hydrogen incorporated into the structure has a beneficial effect towards reducing the density of dangling bonds.

Examples of amorphous semiconducting and insulating materials that can be fabricated into amorphous semiconductor superlattices according to this invention, can be divided into two classes:

(1) Group IVA Elements and Alloys include:
a-Si:H, a-Ge:H, a-Si$_{1-x}$C$_x$:H, a-Si$_{1-x}$Ge$_x$:H, a-Si$_{1-x}$N$_x$:H, a-Si$_{1-x}$Sn$_x$:H, a-Si$_{1-x}$Sn$_x$:H, a-Si$_{1-x}$O$_x$:H, a-C:H (tetrahedrally coordinated) a-Si$_{1-x-y}$O$_x$N$_y$:H plus alloys and halogenated (F, Cl) versions of the hydrogenated materials listed (e.g. a-Si$_{1-x-y}$Ge$_x$Sn$_y$:H:F).

(2) Group IVA Elements and Alloys Doped with Group IIIA and VA Elements
Suitable n type dopants include N, P, As, Sb, and suitable p type dopants include B, Al, Ga, In, Tl.

As used herein, the subscripts are the atomic fractions of the elements in the material. For example, if x=2/3, then a-Si$_{1-x}$O$_x$:H is a-Si$_{1/3}$O$_{2/3}$:H which is a-SiO$_2$:H.

Layers 1, 3, 5 . . . and layers 2, 4, 6 . . . may comprise any two of the materials where both are selected from the same class, e.g. a-Si:H/a-Si$_{1-x}$N$_x$:H or n-doped a-SiH/p-doped a-Si:H.

In addition the alternating layers may include one material from class 1 alternating with a material from class 2, e.g. a-Si:H/n-doped a-Si$_{1-x}$N$_x$:H.

The superlattice used in the present invention also includes layered materials where the composition of each layer is modulated across the layers. For example, if the alternating layers are a-Si:H and a-Ge:H alloys, the transition from a-Si:H to a-Ge:H and from a-Ge:H to a-Si:H may occur gradually over the layer thicknesses starting with a-Si:H, gradually increasing the percentage of a-Ge:H until it is all a-Ge:H. In the next adjacent layer, the percentage of a-Si:H is increased until it is all a-Si:H. All succeeding layers repeat this sequence.

The materials in the two groups can be prepared by plasma assisted decomposition of gaseous mixtures of volatile hydrides, fluorides or chlorides or of the elemental gases themselves in the case of O$_2$, N$_2$, Cl$_2$ and F$_2$, as described below.

PREPARATION OF SUPERLATTICE MATERIAL

There are several deposition processes that are known to produce low defect density amorphous semiconductors. These include PCVD, low temperature CVD and sputtering. Low temperature CVD is restricted to reactive gases that decompose at relatively low temperature such as for example Si$_2$H$_6$. Sputtering has the advantage of being capable of producing a wider variety of amorphous semiconductor materials than can be made by PCVD or CVD, however, sputtered films usually contain more defects than PCVD films. We describe here a method for using PCVD to make amorphous semiconductor superlattices. To make amorphous semiconductor superlattices by CVD we simply omit the electric discharge used in the PCVD technique. To make amorphous semiconductor superlattices by sputtering it is possible to modify the technique (A. H. Eltoukhy and I. E. Greene *J. Appl. Phys.* 50, 505(1979)) for making crystalline semiconductor superlattices by changing the deposition conditions (e.g.

substrate temperature, gas pressure and addition of $H_2$ to the plasma discharge) to produce hydrogenated amorphous rather than crystalline semiconductors.

Figure 5:
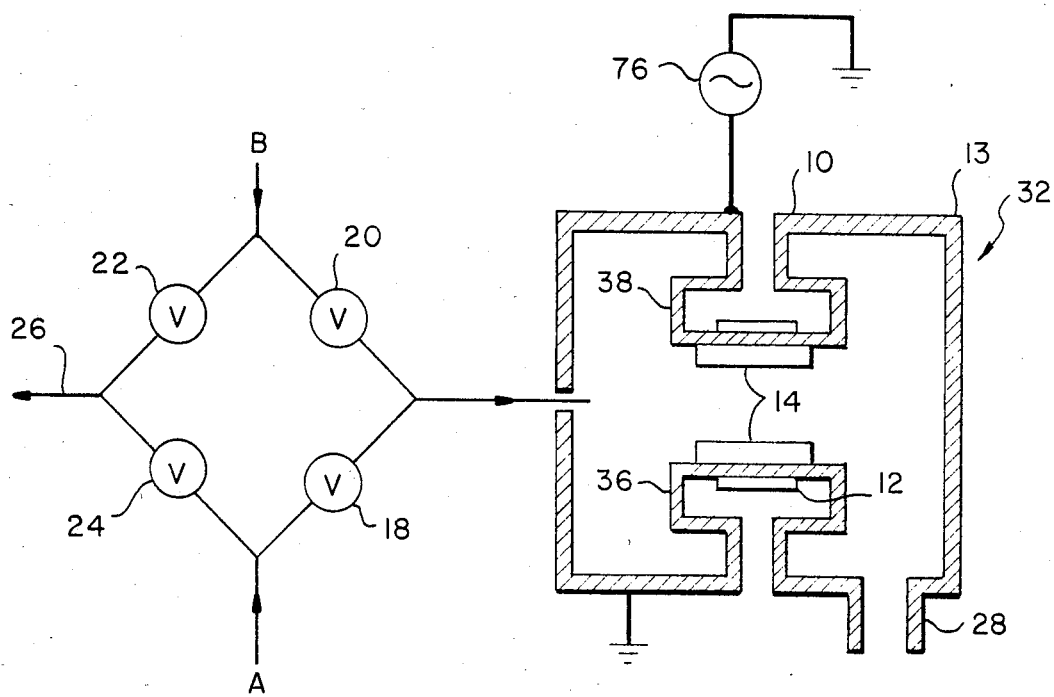
FIG. 5 is a schematic diagram of a plasma assisted chemical vapor deposition reactor.

Referring to FIG. 5 a PCVD apparatus for carrying out the fabrication of the superlattice material of the present invention is designated as 32. The PCVD apparatus includes a vacuum chamber typically of stainless steel. In the vacuum chamber 13 are electrodes 36 and 38. Electrode 36 is grounded and referred to as the anode. Electrode 38 is insulated from the stainless steel chamber by insulator 10 and is referred to as the cathode. Flat heaters 12 are contained in the electrodes. Substrates 14 which can be insulators such as quartz or metals such as stainless steel are placed in good thermal contact with the electrodes.

The plasma is produced by a low power (5-10 W) RF (13.5 $MH_z$) discharge, by means of an RF generator 76 connected to the cathode. To deposit layered films the composition of the gas in the reactor 32 is changed periodically by opening and closing alternately pneumatic valves 18 and 20 to admit gas A or gas B into the reactor.

In order to avoid setting up pressure transients through the opening and closing of valves 18 and 20 the gases A and B are alternatively shunted into a ballast pump 26 by opening and closing valves 22 and 24 in phase with valves 18 and 20, respectively. The gases are pumped continuously out of the reactor by a pump through outlet 28.

To achieve abrupt changes in composition between adjacent layers requires that the time it takes to change gases in the reactor (molecular residence time) be short compared to the time it takes to grow a monolayer. The molecular residence time R is given by $$R = Vp/F_o P_o$$

where V is the volume of the reactor, p is the gas pressure in the reactor and $F_o$ is the gas flow rate at standard pressure $P_o$. R can be varied over a wide range of values. In our experiments we have used V=30 liters, p=30 m torr, Fo=0.1 liter/min which gives R=1 sec. With a typical deposition rate of 1 Å/sec. the transition from one layer to the next takes place over a distance of less than a single atomic layer. The sub layer thickness is given by the product of the deposition rate and the flow period of the gas. The thickness of the sublayers can be varied from a submonolayer to thousands of angstroms.

Example of amorphous semiconductor superlattice that have been produced include:
  a-Si:H/a-Ge:H
  a-Si:H/a-Si$_{1-x}$N$_x$:H
  a-Si:H/a-Si$_{1-x}$C$_x$:H The a-Si:H sublayers were made from pure $SiH_4$. The Ge:H sublayers were made from a mixture of 10% $GeH_4$+90% $H_2$. The a-Si$_{1-x}$C$_x$:H sublayers were made from a mixture of 50% $SiH_4$+50% $CH_4$. The a-Si$_{1-x}$N$_x$:H layers were made from a mixture of 20% $SiH_4$+80% $NH_3$. The substrate temperatures were in the range 180°-250° C.

INTERNAL ELECTRIC FIELDS

It has been found that the amorphous superlattice material of the present invention have large electric fields (up to $4 \times 10^5$ V/cm), with the sign of the fields alternating between layers. For an a-Si:H/a-SiN$_x$:H amorphous superlattice, these fields are caused by electrons transferred from the nitride to the silicon which are asymmetrically distributed near the interfaces. The interface charge involved ($6 \times 10^{12}$ cm$^{-2}$) is similar in magnitude to that observed in silicon nitride films deposited onto crystalline silicon. However, it is greatest when amorphous silicon is deposited onto silicon nitride, and is concentrated within 20 Å of the interface. This charge is due to strain relieving defects induced by lattice mismatch at the interface.

These large electric fields are distributed so that they point away from the substrate in the a-Si:H layer and toward the substrate in the a-SiN$_x$:H layer. These fields remove the symmetry normally present in amorphous materials, with the direction of the fields imposed by the order of deposition. This lack of reflection symmetry is necessary for a non-zero piezoelectric effect. The built-in electric fields between the layers take the place of the fields present between the atoms in a non-centro-symmetric crystal. In the example described below, the fields are large ($4 \times 10^5$ V/cm) similar in magnitude to atomic fields.

It is also possible to remove the intrinsic symmetry by grading the composition of the amorphous superlattice in an asymmetric manner. For example, FIG. 2 shows the electron energy diagram of a material where the composition is changed gradually from a-Si:H to a-SiN$_x$:H to a point where it is abruptly changed back to a-Si:H to begin a new layer. Such a material would have large asymmetric built-in fields and thus be piezoelectric.

Charged defects exist at interfaces both in crystalline and amorphous materials. Thus, both crystalline and amorphous superlattice materials have large built-in fields which remove reflection symmetry. In the case of some crystalline superlattices, this allows an electro-optic effect whereas in others (which intrinsically lack a center of symmetry) it adds to the already present effect.

MEASUREMENT OF THE INTERNAL ELECTRIC FIELDS

The built-in electric fields in these layered structures have been measured from electroabsorption spectroscopy. Electroabsorption is the change in optical absorption due to an applied electric field, commonly known in crystals as the Franz-Keldysh effect. Electroabsorption in amorphous semiconductors has been studied both theoretically and experimentally, see e.g., B. Esser, Phys. Stat. Solid; (b)51, 735, (1972); J. Stuke and G. Weiser, Phys. Stat. Solidi 17, 343 (1966) and R. A. Street, T. M. Searle, I. G. Austin and R. S. Sussman, J. Phys. C. 7, 1582 (1974).

The effect is a maximum at photon energies near the bandgap and decreases sharply at lower energies. In addition to providing spectroscopic information about thin film materials, electroabsorption can be used to determine internal electric fields in device configuration. Nonomura et al, Jap. J. Appl. Phys. 21, L464 (1982); have measured the built-in potential of n-i-p amorphous silicon solar cells by monitoring the transmission of a film subjected to both a constant and an alternating field. The electroabsorption signal goes to zero when the applied dc field cancels out the internal fields thereby yielding the built-in potential.

INTERNAL ELECTRIC FIELDS FOR a-Si:H/a-SiN$_x$:H

The material used in this example were made up of alternating layers of amorphous silicon hydride (a-Si:H) and amorphous silicon nitride (a-SiN$_x$:H) deposited by plasma assisted chemical vapor deposition of silane and silane:ammonia (1:4 by volume) mixtures as described above. The plasma was not interrupted between layers. Silicon layer thicknesses varied between 8 Å and 1200 Å. Ohmic contacts were used in a sandwich structure so that contact potential did not distort the results.

Making use of the boundary condition that the normal component of the applied electric displacement D=$\epsilon$E is constant, the field within the sample D(x) is the sum of applied and built-in fields:

$$D(x) = D_{dc} + D_{ac}\cos(\omega t) + D_{bi}(x) \qquad (1)$$

Here $D_{dc}$ is the dc component and $D_{ac}$ is the ac component of the applied fields. $D_{bi}(x)$ is the built-in field, and x is the distance normal to the layers. The local absorption constant changes as the square of the field.

$$\alpha(x) = \alpha_o(x)[1 + KD^2(x)] \qquad (2)$$

where $\alpha_o(x)$ is the zero-field absorption coefficient and K is an electro-optic material parameter which varies with photon energy. In a transmission measurement such as performed here the quantity measured is the change in the spatial average of $\alpha(x)$.

$$\overline{(\alpha - \alpha_o)} = \frac{1}{d} \int \alpha_o(x) K D^2(x) dx \qquad (3)$$

where d is the sample thickness. A lock-in detector was used to isolate the portion of (3) which varied at the frequency $\omega$. Substituting (1) into (3) we obtain $$\Delta\alpha_w = \frac{2}{d} D_{ac} \int \alpha_o(x) K [D_{dc} + D_{bi}(x)] dx \qquad (4)$$

Because the bandgap of a-SiN$_x$ is ~4 eV, we can assume that the silicon nitride layers contribute negligibly over the photo energy range studied (1.2–3.0 eV). Assuming that the built-in fields are the same in each silicon sublayer, simple electrostatics gives the change in absorption in terms of the applied voltages $V_{ac}$ and $V_{dc}$:

$$\Delta\alpha_\omega \sim \alpha_{so} K_s V_{ac} \left[ \phi_s + (V_{dc}/N)\left(1 + \frac{L_n \epsilon_s}{L_s \epsilon_n}\right)^{-1} \right] \qquad (5)$$

Here $\alpha_{SO}$ and $K_S$ are the absorption and electroabsorption constants of a-Si:H$_x$, and N is the number of layer pairs. The sublayer thicknesses are $L_S$ and $L_n$ for the a-Si:H and a-SiN$_x$:H layers, and the dielectric constants are $\epsilon_s = 12\epsilon_o$ and $\epsilon_n = 7.5\epsilon_o$. This equation gives the built-in potential across a single silicon layer, $\phi_s = \int_0^{L_s}(D/\epsilon_s)dx$.

Figure 6:
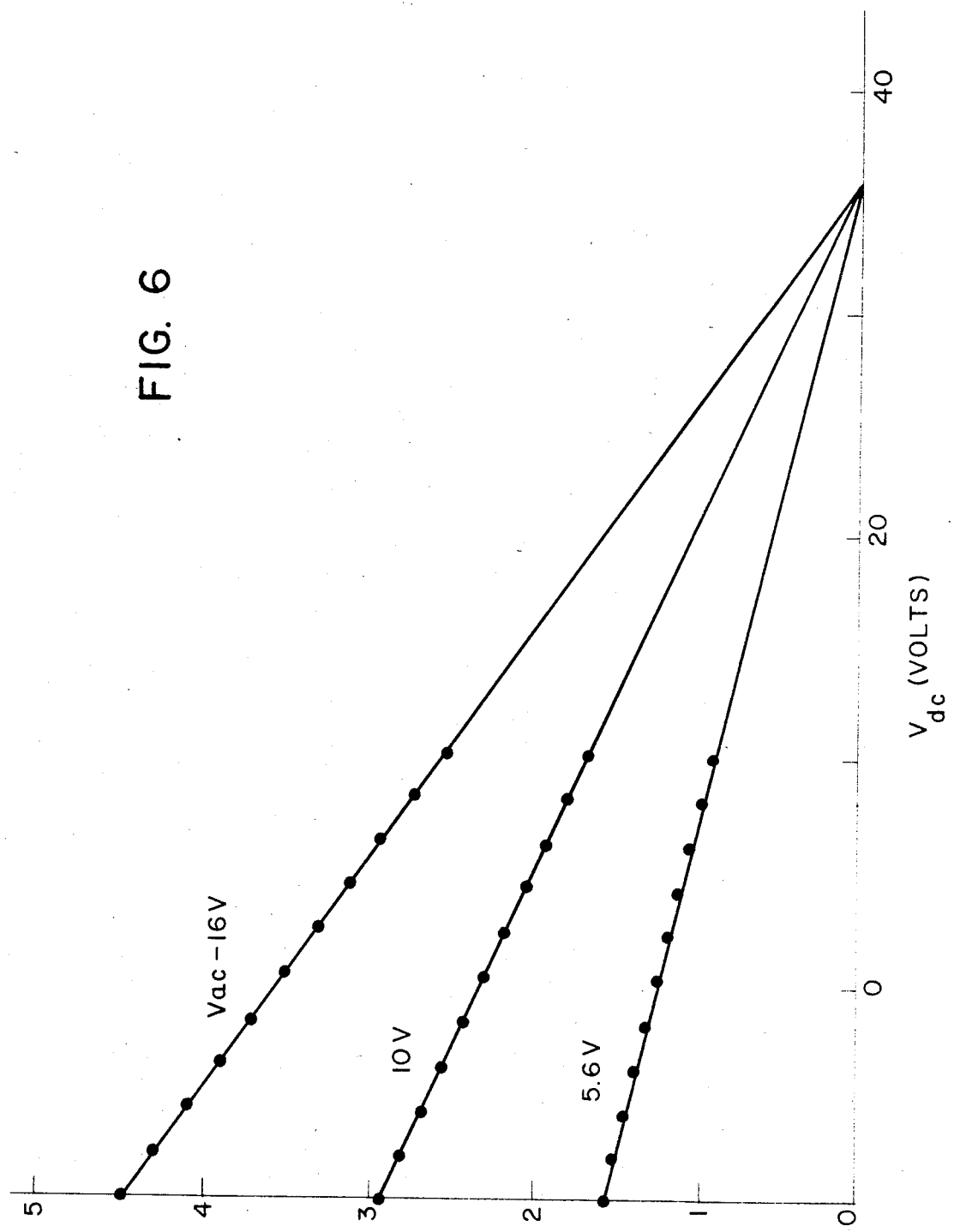
FIG. 6 shows the electroabsorption signal vs. dc voltage for a Si/SiN$_x$ superlattice with layer thickness L$_S$=20 Å; sample thickness 1.0 μm, photon energy 1.94 eV.

FIG. 6 shows $\Delta\alpha\omega$ plotted against $V_{dc}$ for two films with $V_{ac}$ as a parameter. The linearity with respect to $V_{dc}$ and $V_{ac}$ expressed in (5) was obeyed exactly to within experimental error (3%). The $V_{dc}$=36 V intercept of the lines in FIG. 6 is given by $V_{dc} = \phi_s N(L_s\epsilon_n + L_n\epsilon_s)/L_s\epsilon_n$. This intercept varies from film to film as the thickness and potential changes, and was as high as 72 V. This is much too high to be accounted for by contact effects. Films of the same layer thicknesses but varying in total sample thickness from 0.2 to 4 μm yielded the same $\phi_s$ within 20%.

The built-in potentials can only be caused by charges which are assymetrically placed within the sublayers so that reflection symmetry is absent in the material. Their existence shows that the order of deposition determines the properties of the interfaces. The assymetry is caused by structural defects created during the deposition. Silicon differs greatly from silicon nitride both in crystal structure and lattice constant. These structural mismatches cause strain at the interface which is relieved as the material grows through the introduction of defects.

When silicon is deposited onto silicon nitride, these defects are primarily in the silicon because it is much easier to introduce defects into the silicon as it is growing than it is to introduce them into the already grown nitride. It is reasonable to expect that the defect density would be proportional to the strain produced by the lattice mismatch and that the strain is relieved as defects are introduced. In this case, the defect density would decrease exponentially with the distance from the interface.

It is believed that these materials are proximity doped; the silicon layers are heavily n-type due to electrons transferred from the nitride layers. In amorphous materials, both these electrons and the corresponding positive charges would be expected to lie in defect states which could be concentrated at the interfaces. If one assumes that the charges causing the built-in fields are negative in the silicon and positive in the nitride as well, the sign of the built-in fields observed here imply that more charge is transferred at the interface where silicon is deposited onto silicon nitride. Because our technique is sensitive only to the difference between the two interfaces, we assume that all charges reside near that interface. From the change in built-in potential as the sublayer thicknesses are varied, we can determine the actual distribution of charge near the interface.

Figure 7:
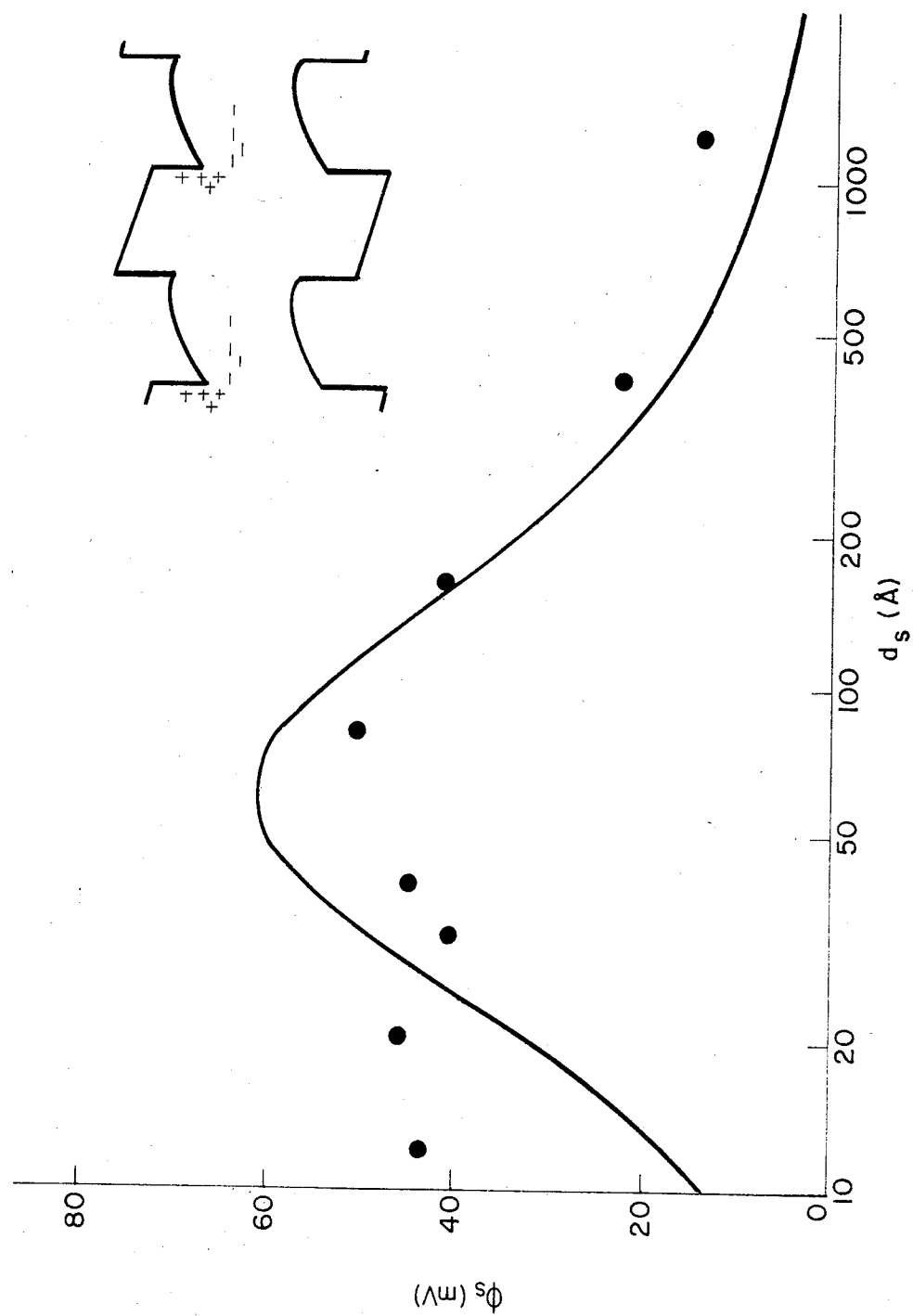
FIG. 7 shows the variation of the singlelayer built-in potential $\phi_S$ with silicon layer thickness L$_S$. The inset shows the charge distribution model chosen for the theoretical line drawn.

Assume a density of traps in the silicon layer which decreases exponentially away from the interface according to $n_t = \rho_o \exp(-x/l)$. These traps are filled, leaving a positive interface charge on the nearby interface, as shown in the inset to FIG. 7. If the charge density is independent of layer thickness, electrostatic calculations show that the resultant built-in potential is $$\phi_S = \frac{\rho_o e l L_n}{L_n \epsilon_s + L_s \epsilon_N} [l - (l + L_s)\exp(-L_x/l)] \qquad (6)$$

where e is the electronic charge. This model is compared with the results obtained for materials with different silicon layer thicknesses $L_S$ in FIG. 7. Here a positive $\phi_s$ designates a field which points away from the substrate. A reasonable qualitative fit is obtained with a defect density of $\rho_o = 3 \times 10^{19}$ cm$^{-3}$ and exponential width l=20 Å. A decrease in $\phi_S$ at larger $L_S$ is observed, consistent with the charge distribution model. However, the built-in potential remains high for low $L_S$, (FIG. 8) indicating that the defect distribution is more sharply peaked close to the interface than the exponential assumed.

The total interface charge density measured here is $\rho_o l = 6 \times 10^{12}$ cm$^{-2}$. This can be compared with the surface charge which has been measured when amorphous silicon nitride is deposited onto crystalline silicon. Such interfaces are important in some metal-insulator-silicon devices. Surface charge densities have been determined from capacitance-voltage characteristics in films deposited by rf glow discharge, chemical vapor deposition and sputtering, see e.g., R. C. G. Swann, R. R. Mehta and T. P. Cauge, J. Electrochem. Soc. 14, 713 (1969); and S. M. Hu, J. Electrochem. Soc. 113, 693 (1966). These measurements show a charge transfer of the same sign as that observed here, with a density between $1 \times 10^{12}$ and $6 \times 10^{12}$, depending upon the method of deposition. The present invention has shown that in amorphous/amorphous interfaces, the interface charge is greatest when silicon is deposited onto silicon nitride. Electrons are concentrated in silicon defects within 20 Å of the interface.

Figure 8:
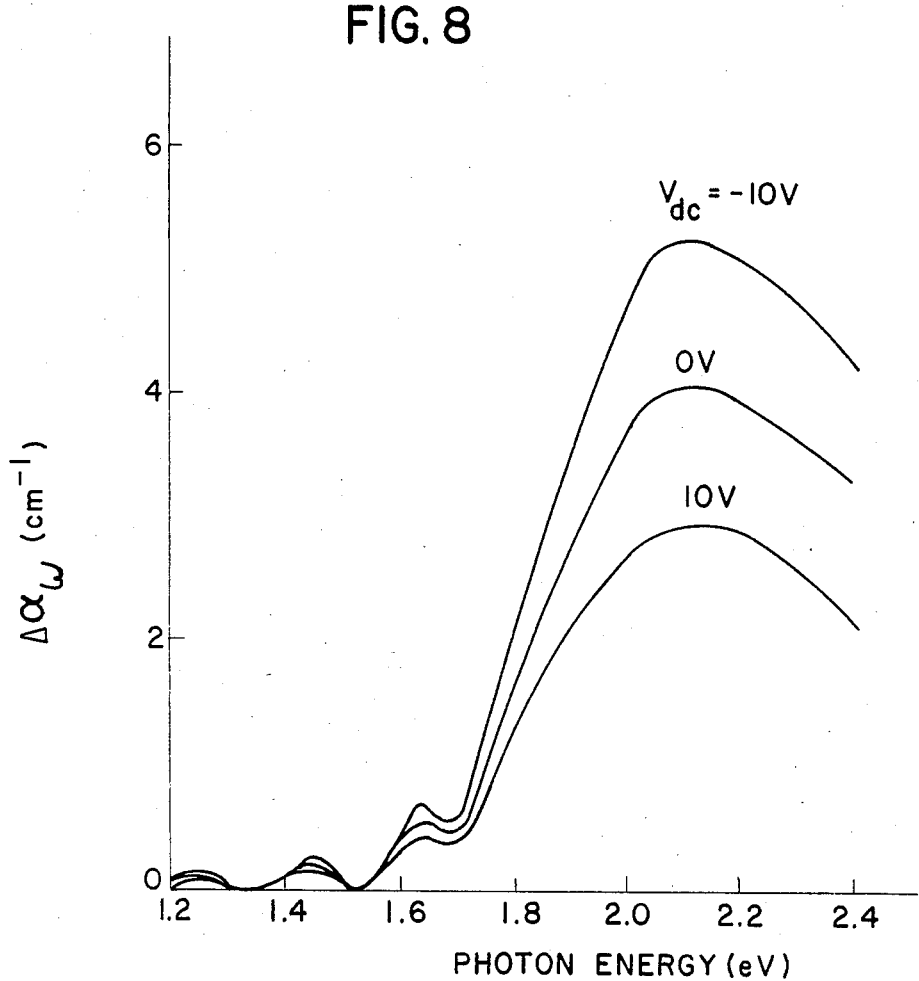
FIG. 8 shows the electroabsorption spectrum for example as in FIG. 6, for three values of V$_{dc}$ where V$_{ac}$ was held constant at 16 V.

Additional information about the interface can be obtained from the spectral dependence of the electroabsorption signal, as shown in FIG. 8. The spectrum is similar to that observed from an unlayered a-Si:H sample except for a small bandgap increase due to carrier confinement. The small signal observed at low photon energies ($h\nu < 1.6$ eV) is due to refractive index changes. The spectral shape observed is the same for all values of $V_{dc}$. In other words, the built-in potential $\phi_s$ is independent of photon energy, for $h\nu$ as high as $E_g + 0.6$ eV. This verifies that the absorption in the nitride layer is negligible. It also indicates that the bandgap changes relatively sharply at the interface between the two layers, for there are no appreciable electric fields in the transition region. This was observed in all the samples studied. In the case of the sample shown in the figures, the built-in voltage changed by less than 3 V out of 30. With a field of $4 \times 10^5$ V/cm at the interface, this indicates that the bandgap shift of 0.6 eV occurs within 3 Å of the interface. This measurement confirms the essentially monolayer shift observed previously by x-ray scattering.

PIEZOELECTRIC COEFFICIENTS

As described above, measurements on a material consisting of 12 Å layers of a-Si alternating with 27 Å layers of a-SiN show a potential drop of 50 mV across each layer. If the compressibility of the two materials which make up the layers is known, then the piezoelectric coefficient can be calculated. It is the single-layer potential drop times the difference in compressibility of the layers, divided by a factor involving the layer thicknesses and dielectric constants. The piezoelectric coefficient of the example material described above is thereby determined to be roughly 1% of that of crystalline quartz, which is one of the most commonly used piezoelectric materials.

It is important to note that the piezoelectric coefficient relies on the difference in compressibility between the two materials. Therefore, the superlattice materials of the invention described herein include materials for the individual layers such that the first layer and alternate layers 1, 3, 5, have the same compressibility and the second and alternate layers 2, 4, 6 have the same compressibility different from that for layers 1, 3, 5 . . . . Using the techniques described above, it is possible to deposit materials having a wide range in mechanical properties, including compressibility.

Figure 9:
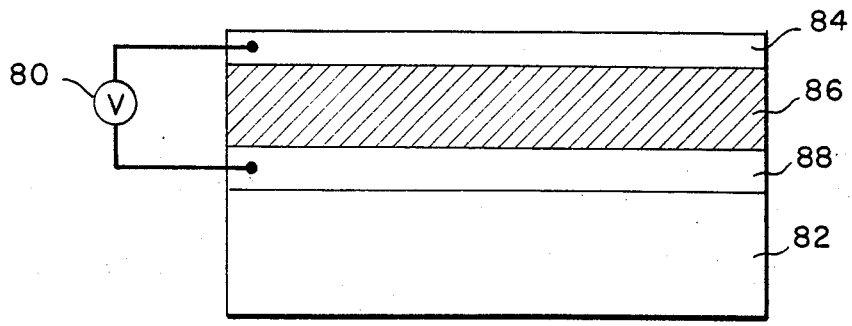
FIG. 9 shows a schematic diagram of a piezoelectric device.

FIG. 9 shows a schematic diagram of a piezoelectric device. The piezoelectric device can be made by depositing metal electrodes 84 and 88 and an amorphous superlattice material 86 onto a substrate 82. An acoustic wave coming from the substrate 82 or from the gas above the device strains the superlattice material producing a voltage 80 at the electrodes. Conversely, a voltage applied to the electrodes will produce an acoustic wave emanating from the superlattice material.

What is claimed is:

1. A piezoelectric device whose active material which exhibits the piezoelectric effect comprises a superlattice which includes a multilayered material wherein layers 1, 3, 5 . . . have the same compressibility and layers 2, 4, 6 . . . have the same compressibility but different from that of layers 1, 3, 5 . . . and wherein electric fields exist across each layer, said electric fields being perpendicular to the interface between layers with the sign of the electric field alternating between adjacent layers.

2. The piezoelectric device of claim 1 whose active material which exhibits the piezoelectric effect comprises a superlattice which includes a multilayered material where a lattice mismatch exists between adjacent layers.

3. The device of claim 1 wherein said superlattice is amorphous.

4. The device of claim 2 wherein said superlattice is amorphous.

5. The device of claim 3 wherein the electric fields are greater than $10^4$ volts/cm.

6. The device of claim 4 wherein the lattice mismatch is greater than 1 part in $10^3$.

7. The piezoelectric device whose active material which exhibits the piezoelectric effect comprises an amorphous superlattice wherein charge is assymetrically distributed at the interfaces thereby causing electrical fields between adjacent layers of said superlattice.

8. The device of claim 7 wherein said charge is within 20 Å of said interfaces.

9. The device of claim 7 wherein said charge is greater than $10^{12}$ electrons/cm$^2$.

10. A piezoelectric device whose active material which exhibits the piezoelectric effect comprises an amorphous superlattice which includes a multilayered material wherein electric fields exist across each layer, said electric fields being perpendicular to the interface between layers with the sign of the electric field alternating between adjacent layers, wherein said superlattice includes layers of a-Si:H/a-SiN$_x$:H or layers of a-Si:H/a-SiC$_x$:H.

11. A piezoelectric device whose active material which exhibits the piezoelectric effect comprises an amorphous superlattice which includes a multilayered material where a lattice mismatch exists between adjacent layers, wherein said superlattice includes layers of a-Si:H/a-SiN$_x$:H or layers of a-SiH/a-SiC$_x$:H.

* * * * *